United States Patent
Wu et al.

(10) Patent No.: US 10,276,726 B2
(45) Date of Patent: Apr. 30, 2019

(54) NON-VOLATILE MEMORY CELL AND NON-VOLATILE MEMORY

(71) Applicant: Taiwan Semiconductor Manufacturing Co., Ltd., Hsinchu (TW)

(72) Inventors: Jiun Shiung Wu, Pingtung County (TW); Ya-Chin King, Taipei (TW); Chrong-Jung Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/168,252

(22) Filed: May 31, 2016

(65) Prior Publication Data

US 2017/0345941 A1    Nov. 30, 2017

(51) Int. Cl.
*H01L 29/66*    (2006.01)
*H01L 29/788*    (2006.01)
(Continued)

(52) U.S. Cl.
CPC .... *H01L 29/7883* (2013.01); *H01L 27/11519* (2013.01); *H01L 27/11524* (2013.01); *H01L 27/11526* (2013.01); *H01L 29/7881* (2013.01)

(58) Field of Classification Search
CPC .......... H01L 2029/7858; H01L 29/785; H01L 29/788–29/7889; H01L 29/42324–29/42336; H01L 21/28273; H01L 21/823431; H01L 21/823821; H01L 27/10826; H01L 27/10879; H01L 27/11517–27/1156; H01L 29/42328; H01L 29/4234; H01L 29/66825; H01L 29/66833; H01L 29/7883; H01L 27/11526; H01L 27/11524; H01L 27/11519; H01L 27/11558; H01L 27/11563; H01L 27/11529; H01L 27/11531; H01L 27/11536; H01L 27/11539; H01L 27/11568; H01L 27/1157; H01L 27/11573; H01L 27/1211; H01L 29/28282; H01L 29/792–29/7926; H01L 29/7851; H01L 29/66484; H01L 29/42344; H01L 29/42392; H01L 2924/1434; H01L 2924/1435; H01L 2924/1436; H01L 2924/14361; H01L 2924/14368; H01L 2027/11866; H01L 2027/11868;
(Continued)

(56) References Cited

U.S. PATENT DOCUMENTS 5,643,814 A * 7/1997 Chung ................. H01L 27/115
257/320
7,208,796 B2 * 4/2007 Chang ............... H01L 21/28273
257/239
(Continued)

*Primary Examiner* — Natalia A Gondarenko
(74) *Attorney, Agent, or Firm* — JCIPRNET

(57) ABSTRACT

An non-volatile memory cell is described. The non-volatile memory cell includes a substrate, insulators, a floating gate and a control gate. The substrate has a fin. The insulators are located over the substrate, wherein the fin is located between the insulators. The floating gate is located over the fin and the insulators. The control gate is located over the floating gate on the insulators and includes at least one of first contact slots located over the sidewalls of the floating gate.

17 Claims, 17 Drawing Sheets

(51) Int. Cl.
*H01L 27/10* (2006.01)
*H01L 27/105* (2006.01)
*H01L 27/11519* (2017.01)
*H01L 27/11524* (2017.01)
*H01L 27/11526* (2017.01)
*H01L 27/115* (2017.01)

(58) Field of Classification Search
CPC . H01L 2027/11875; H01L 2027/11885; H01L 2027/11829; H01L 2027/11831; H01L 29/0642; H01L 29/6681; H01L 29/66818; H01L 29/66871; H01L 29/41791; H01L 29/4175; H01L 29/42312; H01L 29/0649; H01L 29/7831; H01L 29/7855; H01L 29/7856; H01L 29/7858; H01L 21/76224; H01L 21/76281; H01L 21/76283; H01L 21/76205; H01L 21/823481; H01L 21/823878

USPC ....... 257/315, 316, 319, 320, 321, 324, 239, 257/261, 318, 326, E29.3, E21.422
See application file for complete search history.

(56) References Cited

U.S. PATENT DOCUMENTS

| | | | | |
|---|---|---|---|---|
| 7,452,776 | B1* | 11/2008 | He | H01L 27/115 257/E21.179 |
| 7,541,237 | B2* | 6/2009 | Yuan | H01L 27/115 257/E21.179 |
| 2008/0121970 | A1* | 5/2008 | Aritome | H01L 21/28273 257/316 |
| 2013/0307051 | A1* | 11/2013 | Chen | H01L 21/28273 257/321 |
| 2014/0367761 | A1* | 12/2014 | Park | H01L 29/42324 257/316 |
| 2015/0035039 | A1* | 2/2015 | Li | H01L 21/845 257/316 |
| 2016/0064398 | A1* | 3/2016 | Toh | H01L 27/11524 257/316 |

\* cited by examiner

NON-VOLATILE MEMORY CELL AND NON-VOLATILE MEMORY

BACKGROUND

Non-volatile memory is a kind of memory having the advantages that it allows multiple data storing, reading or erasing operations. The data stored in the non-volatile memory will be retained even if the power applied to the device is cut off. The non-volatile memory has become a widely adopted memory device in personal computers and electronic equipment.

Along with the rapid progress of science and technologies, the level of integration of semiconductor devices increases, and therefore dimensions of various memory devices need to be further reduced. In the event of reducing the dimensions of the memory devices, it is desirable to increase the reliability of memory cells, so as to further enhance the device performance and lower the production cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
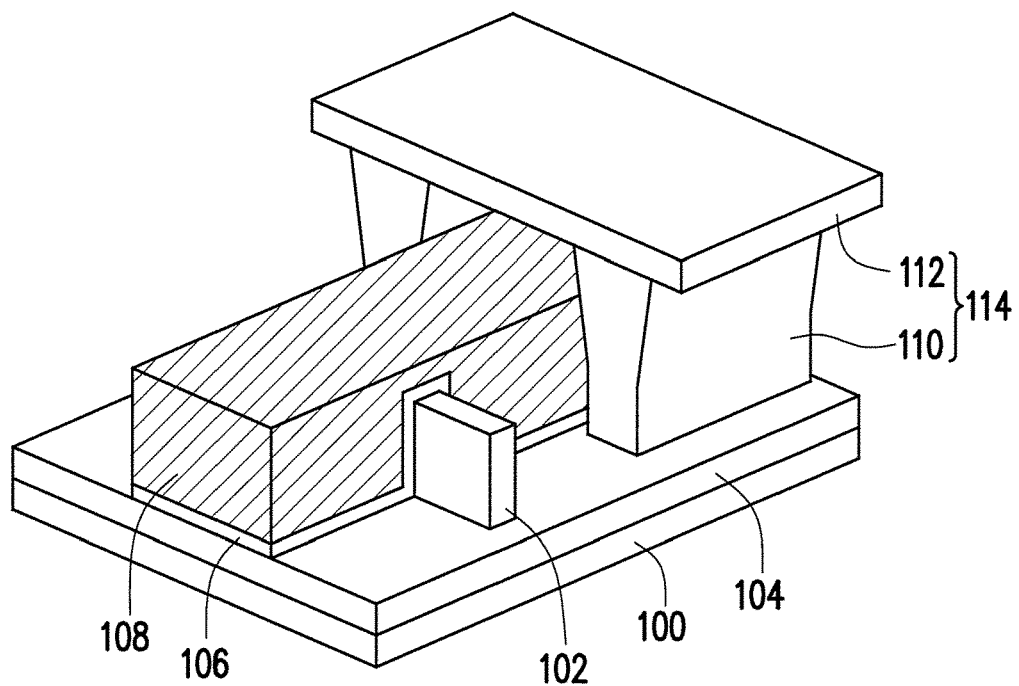
FIG. 1A is a perspective view showing the non-volatile memory according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary non-volatile memory. The non-volatile memory may be formed on bulk silicon substrates in certain embodiments of the present disclosure. Still, the non-volatile memory may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes and the like. The embodiments are not used to limit the contexts.

Figure 1B:
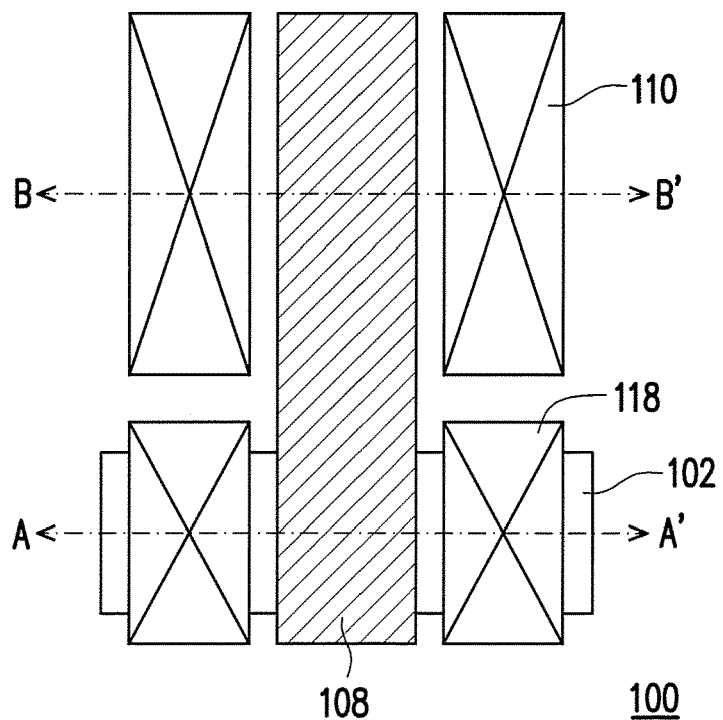
FIG. 1B is a top view showing the non-volatile memory according to some embodiments of the present disclosure.
Figure 1C:
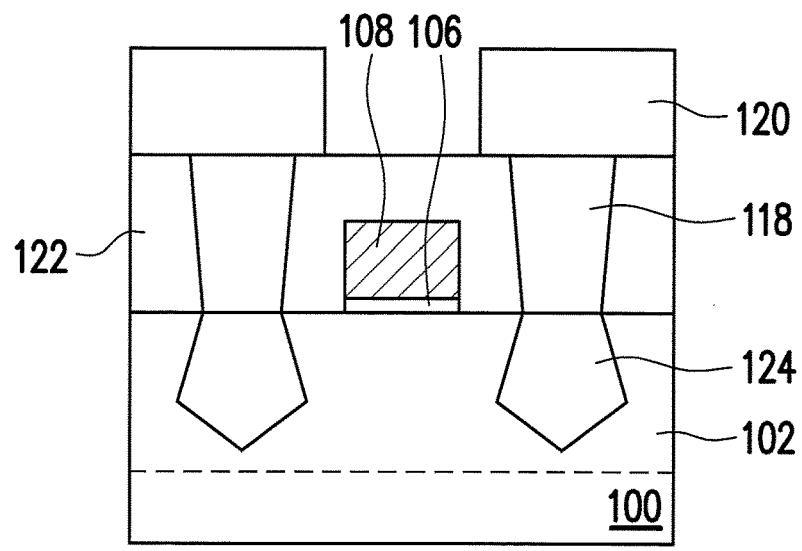
FIG. 1C is a cross-sectional view showing the non-volatile memory taken along the line A-A' of FIG. 1B according to some embodiments of the present disclosure.
Figure 1D:
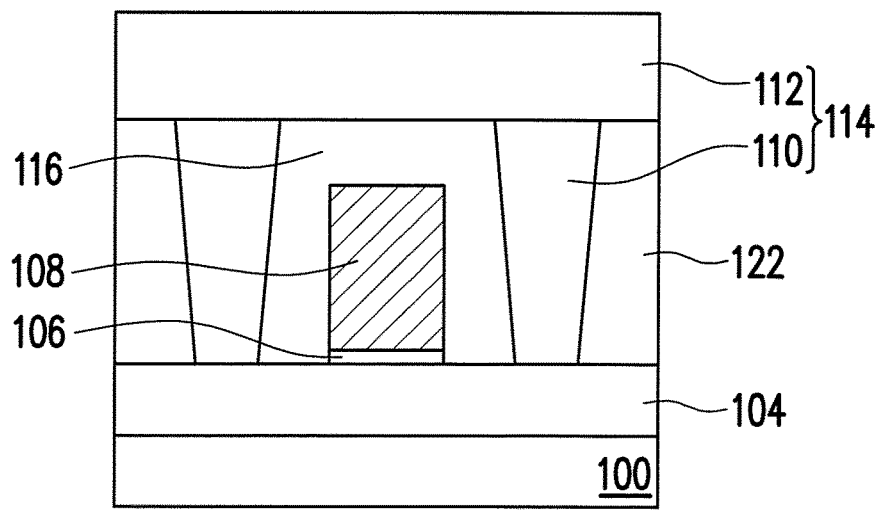
FIG. 1D is a cross-sectional view showing the non-volatile memory taken along the line B-B' of FIG. 1B according to some embodiments of the present disclosure.

In accordance with the embodiments, FIG. 1A is a perspective view showing the non-volatile memory according to some embodiments of the present disclosure. FIG. 1B is a top view showing the non-volatile memory according to some embodiments of the present disclosure. FIG. 1C is a cross-sectional view showing the non-volatile memory taken along the line A-A' of FIG. 1B according to some embodiments of the present disclosure. FIG. 1D is a cross-sectional view showing the non-volatile memory taken along the line B-B' of FIG. 1B according to some embodiments of the present disclosure.

As shown in FIGS. 1A, 1B, 1C and 1D, a non-volatile memory cell includes a substrate 100, insulators 104, a floating gate 108, and a control gate 114.

The substrate 100 having fins 102 thereon is provided. In some embodiments, the substrate 100 is a bulk silicon substrate. Depending on the requirements of design, the substrate 100 may be a p-type substrate or an n-type substrate and include different doped regions. The doped regions may be configured for an n-type memory cell or a p-type memory cell. In some embodiments, the substrate 100 having the fins 102 thereon is formed by the following steps: a mask layer (not shown) is formed over the substrate 100; a photosensitive pattern is formed on the mask layer and over the substrate 100; the substrate 100 is patterned to form trenches (not shown) in the substrate 100 and the fins 102 are formed between the trenches by etching into the substrate 100, using the photosensitive pattern and the mask layer as etching masks; and the photosensitive pattern and the mask layer are removed. In some embodiments, the mask layer is a silicon nitride layer formed by, for example, chemical vapor deposition (CVD). In some embodiments, the trenches are strip-shaped and arranged in parallel.

The insulators 104 are located over the substrate 100 and the fin 102 is located between the insulators 104. In some embodiments, the material of the insulators 104 includes silicon oxide, silicon nitride, silicon oxynitride, a spin-on dielectric material, or a low-k dielectric material. In some embodiments, the insulators 104 are formed by the following steps: an insulating material (not shown) is disposed to fill the trenches by performing high-density-plasma chemical vapor deposition (HDP-CVD), sub-atmospheric CVD (SACVD) or by spin-on; optionally, a chemical mechanical polish process is performed to remove the projected insulating material; and the insulating material filled in the trenches between the fins 102 is partially removed by an etching process.

The floating gate 108 is located over the substrate 100 and on the insulators 104, and across and over the upper portions of the fins 102. The floating gate 108 is located over the fin 102 and the insulators 104. A tunneling dielectric layer 106 is located between the substrate 100 and the floating gate 108. In some embodiments, the floating gate 108 includes polysilicon or a metal-containing material, such as Al, Cu, W, Co, Ti, Ta, Ru, TiN, TiAl, TiAlN, TaN, TaC, NiSi, CoSi or a combination thereof. In some embodiments, the material of the tunneling dielectric layer 106 includes silicon oxide, silicon nitride or a combination thereof. In some embodiments, the tunneling dielectric layer 106 includes a high-k dielectric material, and the high-k dielectric material has a k value greater than 7.0 and includes a metal oxide or a silicate of Hf, Al, Zr, La, Mg, Ba, Ti, Pb and a combination thereof. In some embodiments, the tunneling dielectric layer 106 and the floating gate 108 are formed by depositing an oxide layer (not shown), depositing a polysilicon layer (not shown) over the oxide layer, and then patterning the polysilicon layer and the dielectric layer.

As shown in FIG. 1C, the fin 102 further includes strained material portions 124. The strained material portions 124 are located on opposite sides of the floating gate 108. In some embodiments, the material of the strained material portions 124 includes SiGe, silicon carbon (SiC) or SiP, for example. In some embodiments, the strained material portions 124 are formed by selectively growing epitaxy. The strained material portions 124 are implanted to form source and drain regions. The source and drain regions, also called strained source and drain regions, are located on opposite sides of the floating gate 108. In some embodiments, contacts 118 are respectively located over the strained material portions 124 (source and drain regions), and conductive layers 120 are respectively connected with the contacts 118.

As shown in FIG. 1D, the control gate 114 is located over the floating gate 108 on the insulators 104. In some embodiments, the control gate 114 includes two contact slots 110 located over sidewalls of the floating gate 108. In some embodiments, the control gate 114 is a contact slot 110 located over one sidewall of the floating gate 108. In some embodiments, a material of the contact slots 110 includes a metal-containing material, such as Al, Cu, W, Co, Ti, Ta, Ru, TiN, TiAl, TiAlN, TaN, TaC, NiSi, CoSi or a combination thereof. In some embodiments, the control gate 114 may further include a conductive layer 112 connected with the two contact slots 110. In some embodiments, a material of the conductive layer 112 includes a metal-containing material, such as Al, Cu, W, Co, Ti, Ta, Ru, TiN, TiAl, TiAlN, TaN, TaC, NiSi, CoSi or a combination thereof.

An inter-gate dielectric layer 116 is located between the control gate 114 and the floating gate 108. In some embodiments, the inter-gate dielectric layer 116 may be spacers formed on the sidewalls of the floating gate 108. In some embodiments, a material of the inter-gate dielectric layer 116 is silicon oxide/silicon nitride/silicon oxide, and a method of forming the inter-gate dielectric layer 116 includes forming a silicon oxide layer, a silicon nitride layer and a silicon oxide layer in sequence by a CVD process or a thermal oxidation process. In some embodiments, the material of the inter-gate dielectric layer 116 can also be silicon oxide, silicon nitride or silicon oxide/silicon nitride or similar materials, and the method of forming the inter-gate dielectric layer 116 can include performing a CVD process by using different reaction gases depending on the material thereof. In some embodiments, the material of the inter-gate dielectric layer 116 includes silicon carbide nitride (SiCN), silicon-carbon-oxy-nitride (SiCON) or a combination thereof, and the method of forming the inter-gate dielectric layer 116 can include performing atomic layer deposition (ALD).

In some embodiments, the contact slots 110, the contacts 118, the conductive layer 112 and the conductive layer 120 are formed in the following steps: an interlayer dielectric layer 122 is formed over the substrate 100; the interlayer dielectric layer 122 is patterned to form contact holes; the contact slots 110 and the contacts 118 are formed to fill the contact holes; a conductive material layer is formed over the interlayer dielectric layer 122; and the conductive material layer is patterned to form the conductive layer 112 and the conductive layer 120. In some embodiments, the contact slots 110 and the contacts 118 are formed in the same process or different processes; and the conductive layer 112 and the conductive layer 120 are formed in the same process or different processes.

In the above embodiments, the control gate 114 is a contact slot 110 located over the sidewall of the floating gate 108, and an area between the control gate 140 and the floating gate 108 is increased to raise the gate coupling ratio (GCR) of the cell, and a higher coupling ratio is obtained by enlarging the length of the contact slot. The thin inter-gate dielectric layer 116 (spacer) increases the coupling ratio. Further, the process for manufacturing the non-volatile memory is compatible to a FinFET process. The floating gate may be formed by a metal gate (MG) process of the FinFET process.

Figure 2A:
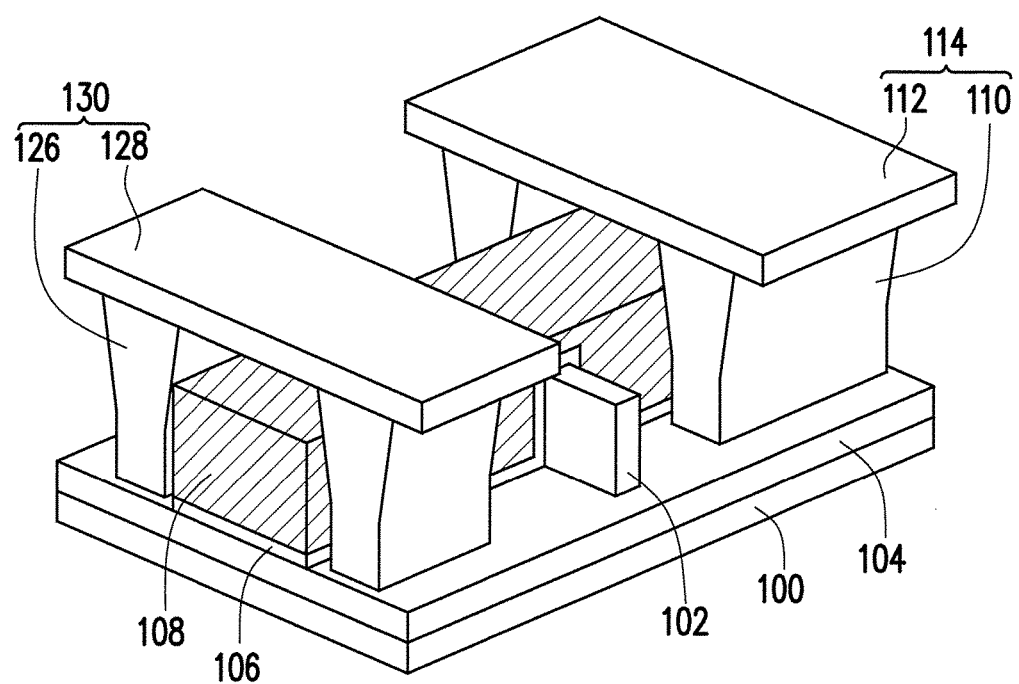
FIG. 2A is a perspective view showing the non-volatile memory according to some embodiments of the present disclosure.
Figure 2B:
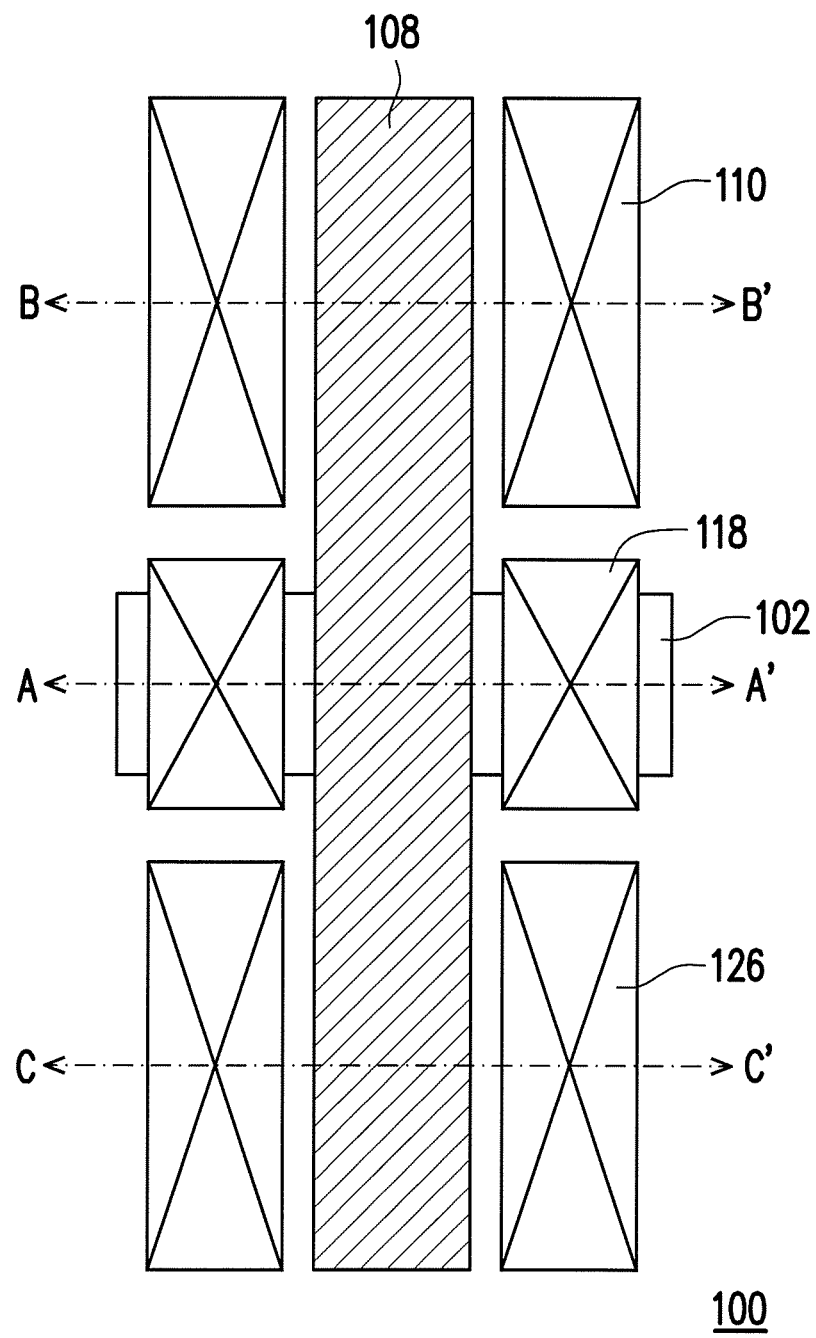
FIG. 2B is a top view showing the non-volatile memory according to some embodiments of the present disclosure.
Figure 2C:
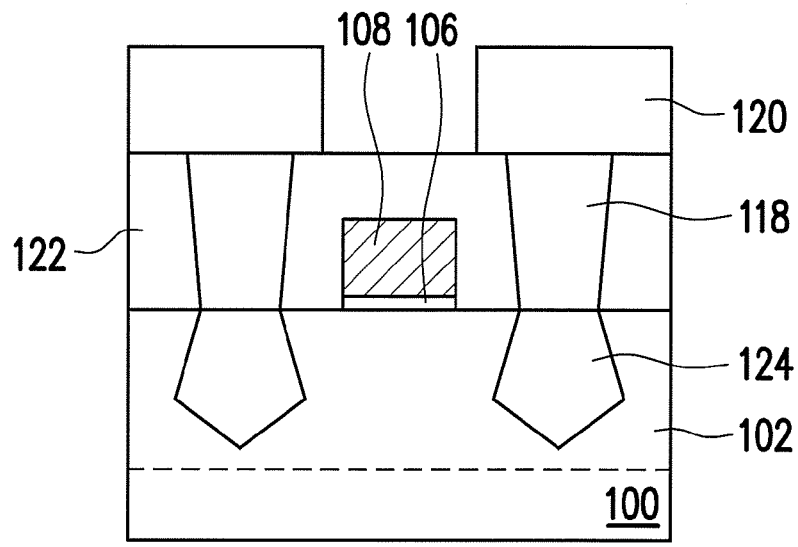
FIG. 2C is a cross-sectional view showing the non-volatile memory taken along the line A-A' of FIG. 2B according to some embodiments of the present disclosure.
Figure 2D:
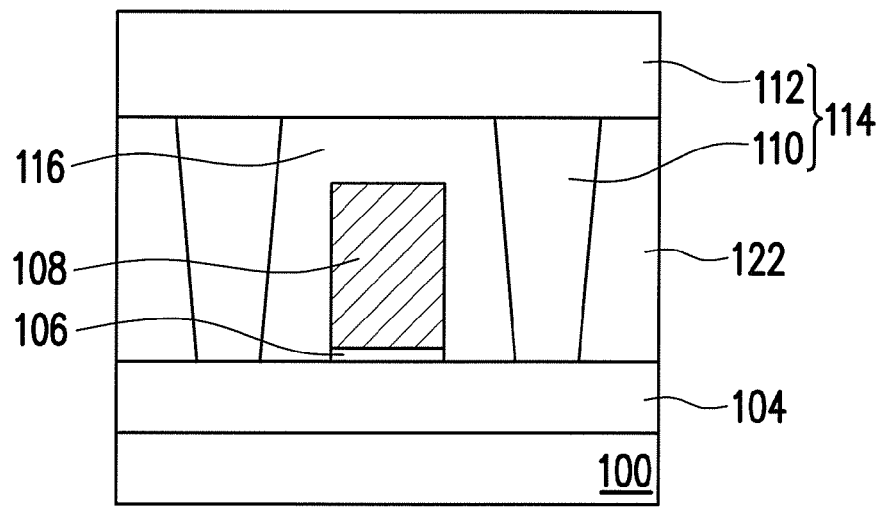
FIG. 2D is a cross-sectional view showing the non-volatile memory taken along the line B-B' of FIG. 2B according to some embodiments of the present disclosure.
Figure 2E:
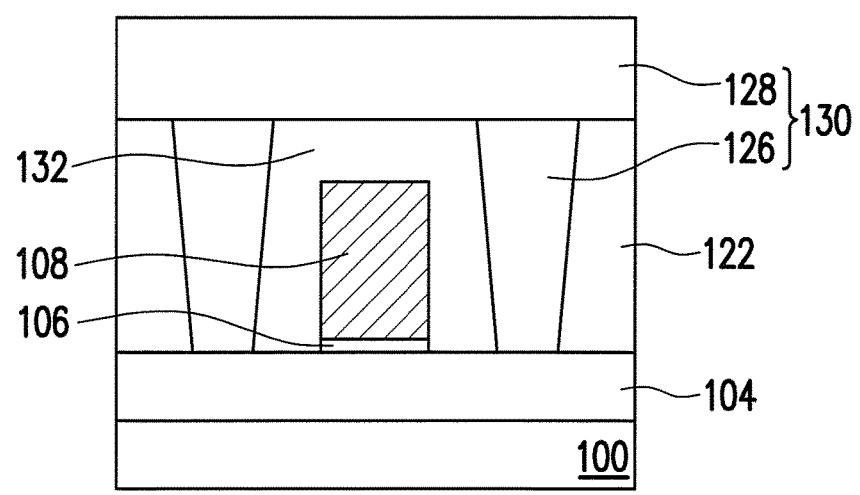
FIG. 2E is a cross-sectional view showing the non-volatile memory taken along the line C-C' of FIG. 2B according to some embodiments of the present disclosure.

In accordance with the embodiments, FIG. 2A is a perspective view showing the non-volatile memory according to some embodiments of the present disclosure. FIG. 2B is a top view showing the non-volatile memory according to some embodiments of the present disclosure. FIG. 2C is a cross-sectional view showing the non-volatile memory taken along the line A-A' of FIG. 2B according to some embodiments of the present disclosure. FIG. 2D is a cross-sectional view showing the non-volatile memory taken along the line B-B' of FIG. 2B according to some embodiments of the present disclosure. FIG. 2E is a cross-sectional view showing the non-volatile memory taken along the line C-C' of FIG. 2B according to some embodiments of the present disclosure.

In FIGS. 2A-2E, elements that are identical to those in FIGS. 1A-1D are marked with the same numerals. Where the materials and properties of each of the layers described below are not specified in detail, they are regarded as identical to those in FIGS. 1A-1D.

As shown in FIGS. 2A, 2B, 2C, 2D and 2E, a non-volatile memory cell includes a substrate 100, insulators 104, a floating gate 108, a control gate 114 and an erase gate 130.

The substrate 100 having fins 102 thereon is provided. In some embodiments, the substrate 100 is a bulk silicon substrate. Depending on the requirements of design, the substrate 100 may be a p-type substrate or an n-type substrate and include different doped regions. The doped regions may be configured for an n-type memory cell or a p-type memory cell.

The insulators 104 are located over the substrate 100 and the fin 102 is located between the insulators 104. In some embodiments, the material of the insulators 104 includes silicon oxide, silicon nitride, silicon oxynitride, a spin-on dielectric material, or a low-k dielectric material.

The floating gate 108 is located over the substrate 100 and on the insulators 104, and across and over the upper portions of the fins 102. The floating gate 108 is located over the fin 102 and the insulators 104. A tunneling dielectric layer 106 is located between the substrate 100 and the floating gate 108.

As shown in FIG. 2C, the fin 102 further includes strained material portions 124. The strained material portions 124 are located on opposite sides of the floating gate 108. In some embodiments, the material of the strained material portions 124 includes SiGe, silicon carbon (SiC) or SiP, for example. In some embodiments, the strained material portions 124 are formed by selectively growing epitaxy. The strained material portions 124 are implanted to form source and drain regions. The source and drain regions, also called strained source and drain regions, are located on opposite sides of the floating gate 108. In some embodiments, contacts 118 are respectively located over the strained material portions 124 (source and drain regions), and conductive layers 120 are respectively connected with the contacts 118.

As shown in FIG. 2D, the control gate 114 is located over the floating gate 108 on the insulators 104. In some embodiments, the control gate 114 includes two contact slots 110 located over the sidewalls of the floating gate 108. In some embodiments, the control gate 114 may further include a conductive layer 112 connected with the two contact slots 110. In some embodiments, the control gate 114 is a contact slot 110 located over one sidewall of the floating gate 108.

An inter-gate dielectric layer 116 is located between the control gate 114 and the floating gate 108. In some embodiments, the inter-gate dielectric layer 116 may be spacers formed on the sidewalls of the floating gate 108. As shown in FIG. 2E, the erase gate 130 is located over the floating gate 108 on the insulators 104. In some embodiments, the erase gate 130 includes two contact slots 126 located over the sidewalls of the floating gate 108. In some embodiments, the erase gate 130 is a contact slot 126 located over one sidewall of the floating gate 108. In some embodiments, the control gate 114 and the erase gate 130 are respectively located over the insulators 104 respectively at two sides of the fin 102. In some embodiments, a material of the contact slots 126 includes a metal-containing material, such as Al, Cu, W, Co, Ti, Ta, Ru, TiN, TiAl, TiAlN, TaN, TaC, NiSi, CoSi or a combination thereof. In some embodiments, the erase gate 130 may further include a conductive layer 128 connected with the two contact slots 126. In some embodiments, a material of conductive layer 128 includes a metal-containing material, such as Al, Cu, W, Co, Ti, Ta, Ru, TiN, TiAl, TiAlN, TaN, TaC, NiSi, CoSi or a combination thereof.

An inter-gate dielectric layer 132 is located between the erase gate 130 and the floating gate 108. In some embodiments, the inter-gate dielectric layer 132 may be spacers formed on the sidewalls of the floating gate 108. In some embodiments, a material of the inter-gate dielectric layer 132 is silicon oxide/silicon nitride/silicon oxide, and a method of forming the inter-gate dielectric layer 132 includes forming a silicon oxide layer, a silicon nitride layer and a silicon oxide layer in sequence by a CVD process or a thermal oxidation process. In some embodiments, the material of the inter-gate dielectric layer 132 can also be silicon oxide, silicon nitride or silicon oxide/silicon nitride or similar materials, and a method of forming the inter-gate dielectric layer 132 can include performing a CVD process by using different reaction gases depending on the material thereof. In some embodiments, the material of the inter-gate dielectric layer 132 includes silicon carbide nitride (SiCN), silicon-carbon-oxy-nitride (SiCON) or a combination thereof, and a method of forming the inter-gate dielectric layer 132 can include performing atomic layer deposition (ALD).

In some embodiments, the contact slots 126, the contact slots 110, the contacts 118, the conductive layer 128, the conductive layer 112 and the conductive layer 120 are formed in the following steps: an interlayer dielectric layer 122 is formed over the substrate 100; the interlayer dielectric layer 122 is patterned to formn contact holes; the contact slots 126, the contact slots 110, and the contacts 118 are formed to fill the contact holes; a conductive material layer is formed over the interlayer dielectric layer 122; and the conductive material layer is patterned to form the conductive layer 128, the conductive layer 112 and the conductive layer 120. In some embodiments, the contact slots 126, the contact slots 110 and the contacts 118 are formed in the same process or different processes; and the conductive layer 128, the conductive layer 112 and the conductive layer 120 are formed in the same process or different processes.

In the above embodiments, the control gate 114 includes a contact slot 110 located over the sidewall of the floating gate 108, and an area between the control gate 140 and the floating gate 108 is increased to raise the gate coupling ratio (GCR) of the cell, and a higher coupling ratio is obtained by enlarging the length of the contact slot 110. The thin inter-gate dielectric layer 116 (spacer) increases the coupling ratio. The erase gate 130 includes a contact slot 126 located over the sidewall of the floating gate 108, and the whole memory cells in an area can be erased by the erase gate 130. Further, the process for manufacturing the non-volatile memory is compatible to a FinFET process. The floating gate may be formed by a metal gate (MG) process of the FinFET process.

Figure 3A:
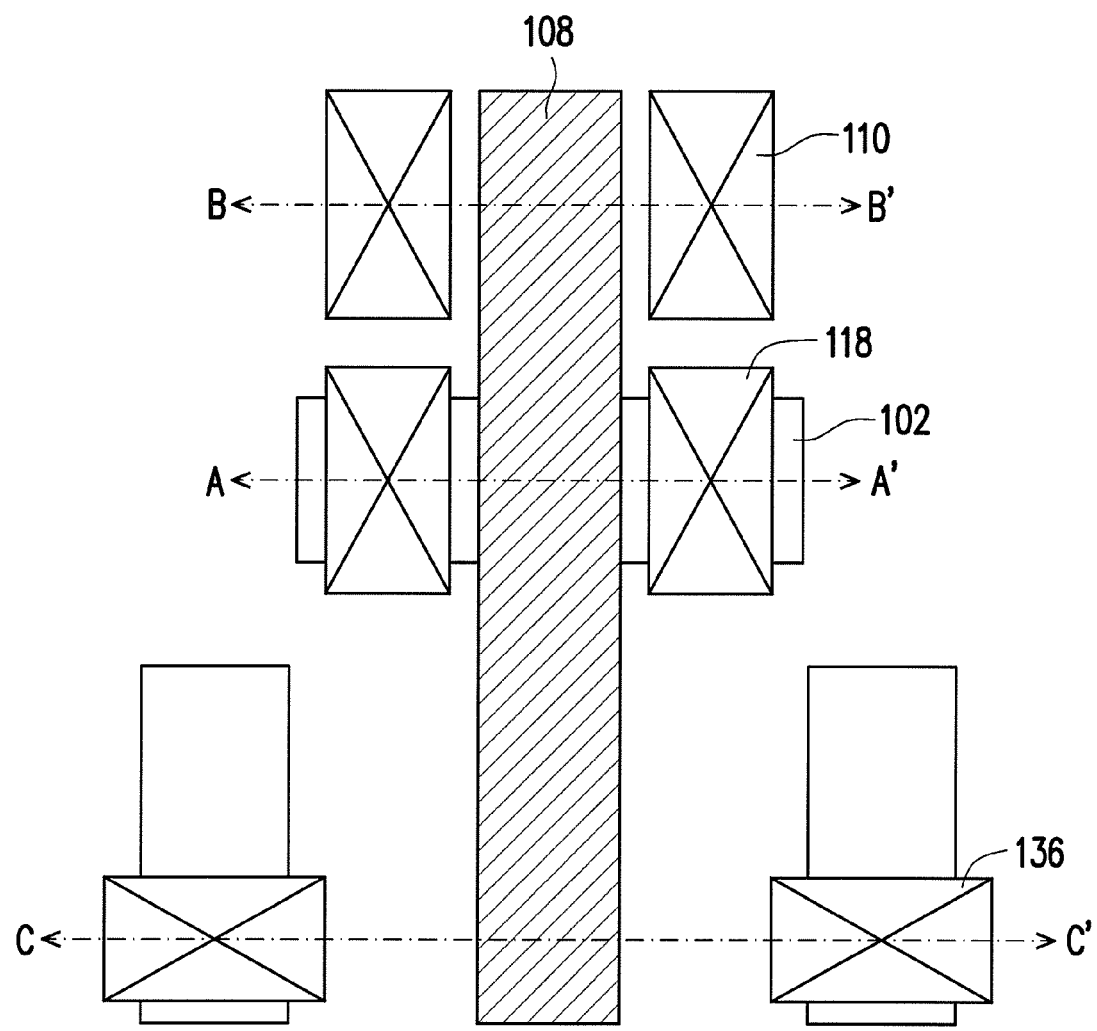
FIG. 3A is a top view showing the non-volatile memory according to some embodiments of the present disclosure.
Figure 3B:
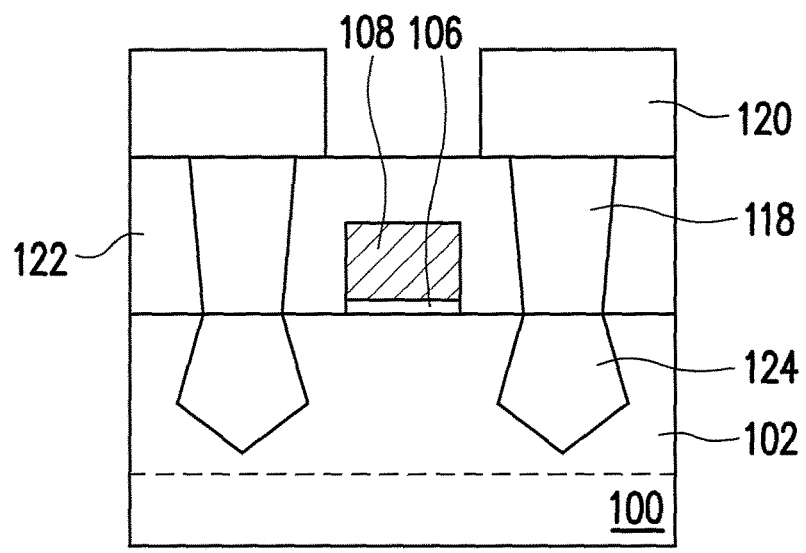
FIG. 3B is a cross-sectional view showing the non-volatile memory taken along the line A-A' of FIG. 3A according to some embodiments of the present disclosure.
Figure 3C:
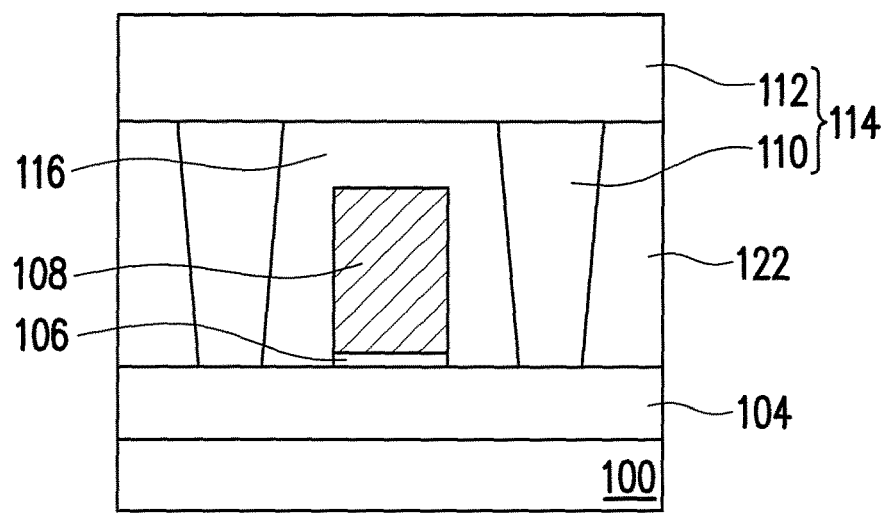
FIG. 3C is a cross-sectional view showing the non-volatile memory taken along the line B-B' of FIG. 3A according to some embodiments of the present disclosure.
Figure 3D:
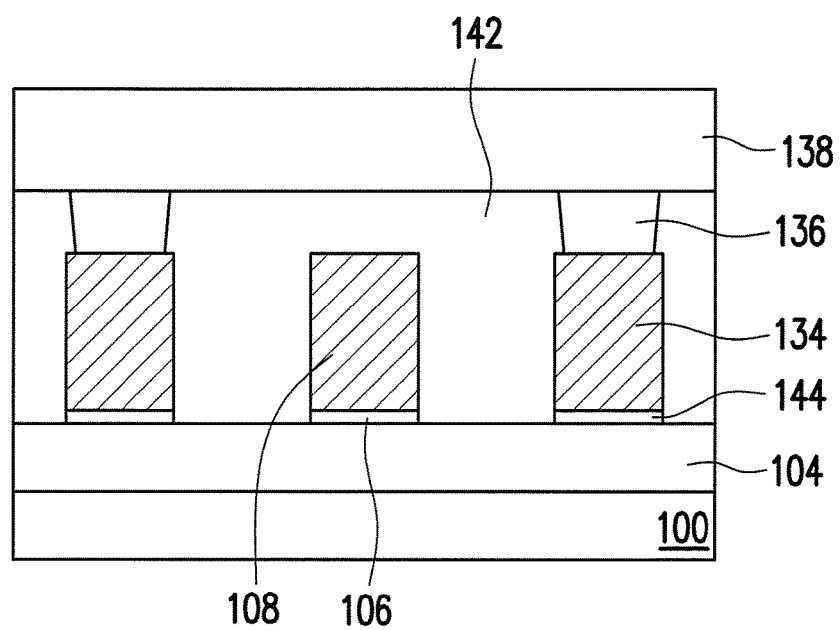
FIG. 3D is a cross-sectional view showing the non-volatile memory taken along the line C-C' of FIG. 3A according to some embodiments of the present disclosure.

In accordance with the embodiments, FIG. 3A is a top view showing the non-volatile memory according to some embodiments of the present disclosure. FIG. 3B is a cross-sectional view showing the non-volatile memory taken along the line A-A' of FIG. 3A according to some embodiments of the present disclosure. FIG. 3C is a cross-sectional view showing the non-volatile memory taken along the line B-B' of FIG. 3A according to some embodiments of the present disclosure. FIG. 3D is a cross-sectional view showing the non-volatile memory taken along the line C-C' of FIG. 3A according to some embodiments of the present disclosure.

In FIGS. 3A-3D, elements that are identical to those in FIGS. 1A-1D are marked with the same numerals. Where the materials and properties of each of the layers described below are not specified in detail, they are regarded as identical to those in FIGS. 1A-1D.

As shown in FIGS. 3A, 3B, 3C and 3D, a non-volatile memory cell includes a substrate 100, insulators 104, a floating gate 108, a control gate 114 and an erase gate 140.

The substrate 100 having fins 102 thereon is provided. In some embodiments, the substrate 100 is a bulk silicon substrate. Depending on the requirements of design, the substrate 100 may be a p-type substrate or an n-type substrate and include different doped regions. The doped regions may be configured for an n-type memory cell or a p-type memory cell.

The insulators 104 are located over the substrate 100 and the fin 102 is located between the insulators 104. In some embodiments, the material of the insulators 104 includes silicon oxide, silicon nitride, silicon oxynitride, a spin-on dielectric material, or a low-k dielectric material.

The floating gate 108 is located over the substrate 100 and on the insulators 104, and across and over the upper portions of the fins 102. The floating gate 108 is located over the fin 102 and the insulators 104. A tunneling dielectric layer 106 is located between the substrate 100 and the floating gate 108.

As shown in FIG. 3B, the fin 102 further includes strained material portions 124. The strained material portions 124 are located on opposite sides of the floating gate 108. In some embodiments, the material of the strained material portions 124 includes SiGe, silicon carbon (SiC) or SiP, for example. In some embodiments, the strained material portions 124 are formed by selectively growing epitaxy. The strained material portions 124 are implanted to form source and drain regions. The source and drain regions, also called strained source and drain regions, are located on opposite sides of the floating gate 108. In some embodiments, contacts 118 are respectively located over the strained material portions 124 (source and drain regions), and conductive layers 120 are respectively connected with the contacts 118.

As shown in FIG. 3C, the control gate 114 is located over the floating gate 108 on the insulators 104. In some embodiments, the control gate 114 includes two contact slots 110 located over the sidewalls of the floating gate 108. In some embodiments, the control gate 114 is a contact slot 110 located over one sidewall of the floating gate 108. In some embodiments, the control gate 114 may further include a conductive layer 112 connected with the two contact slots 110. An inter-gate dielectric layer 116 is located between the control gate 114 and the floating gate 108. In some embodiments, the inter-gate dielectric layer 116 may be spacers formed on the sidewalls of the floating gate 108.

As shown in FIG. 3D, the erase gate 140 is located over the floating gate 108 on the insulators 104. In some embodiments, the erase gate 140 includes conductive lines 134. In some embodiments, the erase gate 140 may further include contact slots 136 and a conductive layer 138. The conductive lines 134 are located respectively on two sides of the floating gate 108. The contact slots 136 are located over the conductive lines 134. The conductive layer 138 is connected with the contact slots 136. In some embodiments, a dielectric layer 144 is located between the substrate 100 and the conductive line 134. In some embodiments, the control gate 114 and the erase gate 140 are respectively located over the insulators 104 respectively at two sides of the fin 102. In some embodiments, the conductive lines 134 include polysilicon or a metal-containing material, such as Al, Cu, W, Co, Ti, Ta, Ru, TiN, TiAl, TiAlN, TaN, TaC, NiSi, CoSi or a combination thereof. In some embodiments, a material of the contact slots 136 includes a metal-containing material, such as Al, Cu, W, Co, Ti, Ta, Ru, TiN, TiAl, TiAlN, TaN, TaC, NiSi, CoSi or a combination thereof. In some embodiments, a material of the conductive layer 138 includes a metal-containing material, such as Al, Cu, W, Co, Ti, Ta, Ru, TiN, TiAl, TiAlN, TaN, TaC, NiSi, CoSi or a combination thereof.

An inter-gate dielectric layer 142 is located between the erase gate 140 and the floating gate 108. In some embodiments, the inter-gate dielectric layer 142 may be spacers formed on the sidewalls of the floating gate 108. In some embodiments, a material of the inter-gate dielectric layer 142 is silicon oxide/silicon nitride/silicon oxide, and a method of forming the inter-gate dielectric layer 142 includes forming a silicon oxide layer, a silicon nitride layer and a silicon oxide layer in sequence by a CVD process or a thermal oxidation process. In some embodiments, the material of the inter-gate dielectric layer 142 can also be silicon oxide, silicon nitride or silicon oxide/silicon nitride or similar materials, and the method of forming the inter-gate dielectric layer 142 can include performing a CVD process by using different reaction gases depending on the material thereof. In some embodiments, the material of the inter-gate dielectric layer 142 includes silicon carbide nitride (SiCN), silicon-carbon-oxy-nitride (SiCON) or a combination thereof, and a method of forming the inter-gate dielectric layer 142 can include performing atomic layer deposition (ALD). In some embodiments, the conductive line 134 and the floating gate 108 are formed in the same process or different processes.

In some embodiments, the contact slots 136, the contact slots 110, the contacts 118, the conductive layer 138, the conductive layer 112 and the conductive layer 120 are formed in the following steps: an interlayer dielectric layer 122 is formed over the substrate 100; the interlayer dielectric layer 122 is patterned to form contact holes; the contact slots 136, the contact slots 110, and the contacts 118 are formed to fill the contact holes; a conductive material layer is formed over the interlayer dielectric layer 122; and the conductive material layer is patterned to form the conductive layer 138, the conductive layer 112 and the conductive layer 120. In some embodiments, the contact slots 136, the contact slots 110 and the contacts 118 are formed in the same process or different processes; and the conductive layer 138, the conductive layer 112 and the conductive layer 120 are formed in the same process or different processes.

In the above embodiments, the control gate 114 includes a contact slot 110 located over the sidewall of the floating gate 108, and an area between the control gate 140 and the floating gate 108 is increased to raise the gate coupling ratio (GCR) of the cell, and a higher coupling ratio is obtained by enlarging the length of the contact slot 110. The thin inter-gate dielectric layer 116 (spacer) increases the coupling ratio. The erase gate 140 includes the conductive line 134 located respectively on two sides of the floating gate 108, and the whole memory cells in an area can be erased by the erase gate 140. More accurate alignment with highly precise spacing is obtained by forming the conductive line 134 and the floating gate 108 in the same process. Further, the process for manufacturing the non-volatile memory is compatible to a FinFET process. The floating gate may be formed by a metal gate (MG) process of the FinFET process.

Figure 4A:
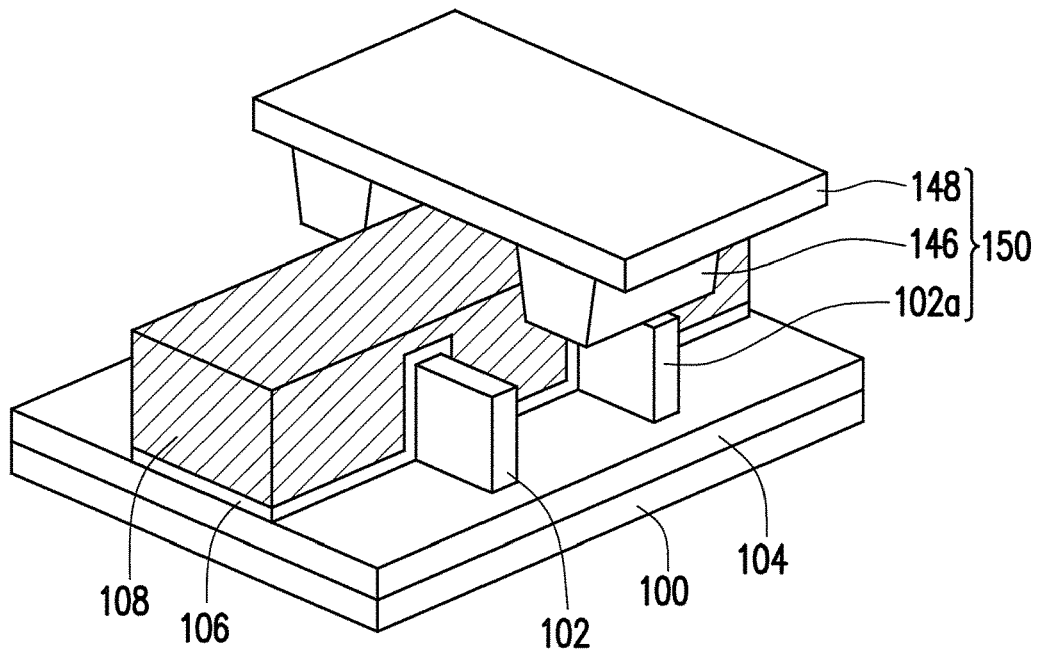
FIG. 4A is a perspective view showing the non-volatile memory according to some embodiments of the present disclosure.
Figure 4B:
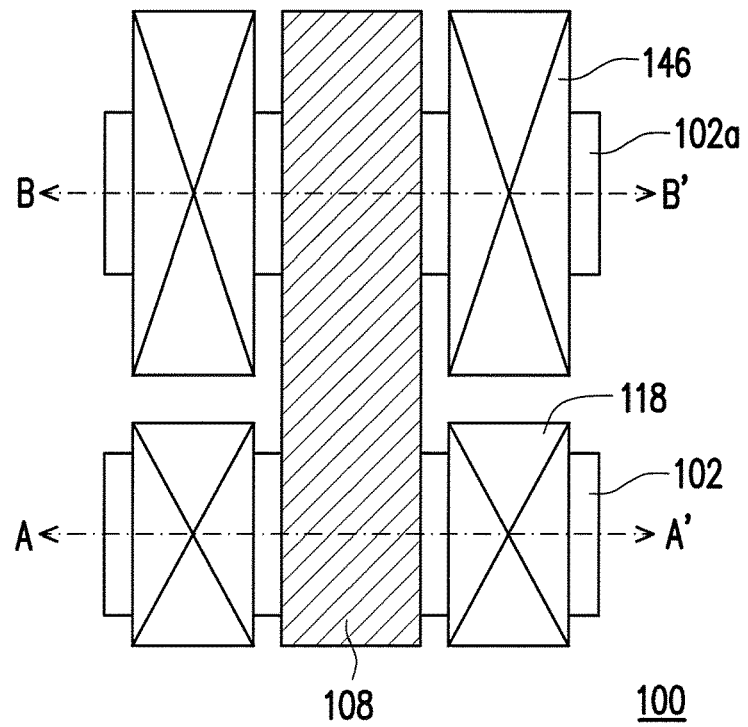
FIG. 4B is a top view showing the non-volatile memory according to some embodiments of the present disclosure.
Figure 4C:
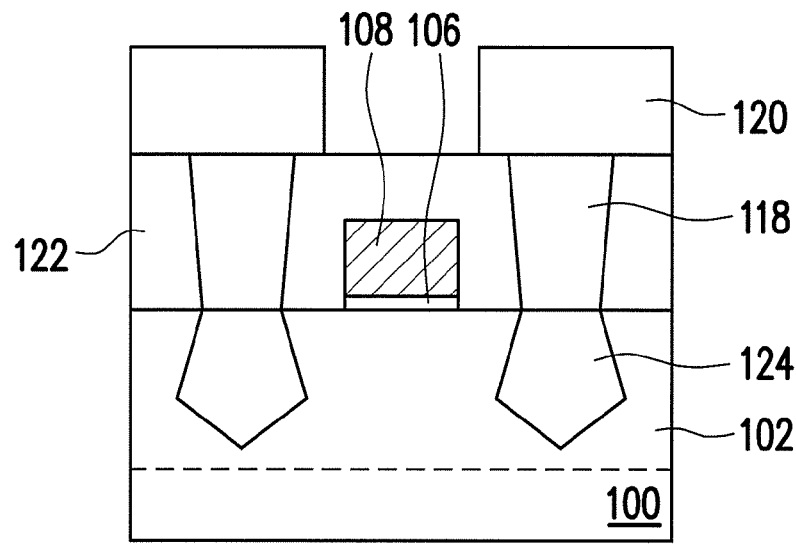
FIG. 4C is a cross-sectional view showing the non-volatile memory taken along the line A-A' of FIG. 4B according to some embodiments of the present disclosure.
Figure 4D:
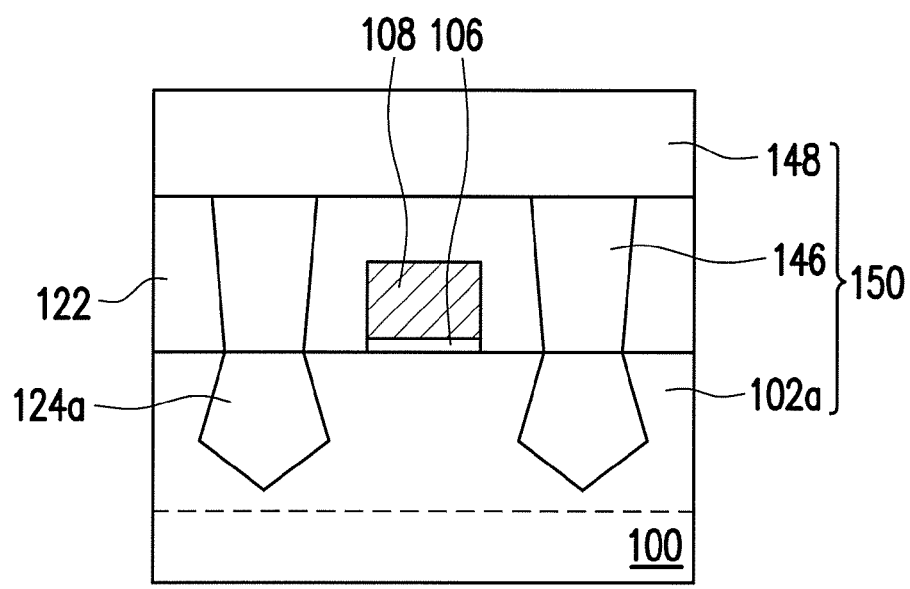
FIG. 4D is a cross-sectional view showing the non-volatile memory taken along the line B-B' of FIG. 4B according to some embodiments of the present disclosure.

In accordance with the embodiments, FIG. 4A is a perspective view showing the non-volatile memory according to some embodiments of the present disclosure. FIG. 4B is a top view showing the non-volatile memory according to some embodiments of the present disclosure. FIG. 4C is a cross-sectional view showing the non-volatile memory taken along the line A-A' of FIG. 4B according to some embodiments of the present disclosure. FIG. 4D is a cross-sectional view showing the non-volatile memory taken along the line B-B' of FIG. 4B according to some embodiments of the present disclosure.

In FIGS. 4A-4D, elements that are identical to those in FIGS. 1A-1D are marked with the same numerals. Where the materials and properties of each of the layers described below are not specified in detail, they are regarded as identical to those in FIGS. 1A-1D.

As shown in FIGS. 4A, 4B, 4C and 4D, a non-volatile memory cell includes a substrate 100, insulators 104, a floating gate 108 and a control gate 150.

The substrate 100 at least having fins 102 and 102a thereon is provided. In some embodiments, the substrate 100 is a bulk silicon substrate. Depending on the requirements of design, the substrate 100 may be a p-type substrate or an n-type substrate and include different doped regions. The doped regions may be configured for an n-type memory cell or a p-type memory cell. A conductive type of the fin 102a is different from that of the fin 102. In some embodiments, the substrate 100 is a p-type substrate, and an n-well is formed in the fin 102a, for example.

In some embodiments, the substrate 100 at least having the fins 102 and 102a thereon is formed by the following steps: a mask layer (not shown) is formed over the substrate 100; a photosensitive pattern is formed on the mask layer and over the substrate 100; the substrate 100 is patterned to form trenches (not shown) in the substrate 100 and the fins 102 and 102a are formed between the trenches by etching into the substrate 100, using the photosensitive pattern and the mask layer as etching masks; and the photosensitive pattern and the mask layer are removed. In some embodiments, the mask layer is a silicon nitride layer formed by, for example, chemical vapor deposition (CVD). In some embodiments, the trenches are strip-shaped and arranged in parallel.

The insulators 104 are located over the substrate 100, and the fin 102 and the fin 102a are respectively located between the insulators 104. The floating gate 108 is located over the substrate 100 and on the insulators 104, and across and over the upper portions of the fin 102 and the fin 102a. The floating gate 108 is located over the fin 102, the fin 102a, and the insulators 104. A tunneling dielectric layer 106 is located between the substrate 100 and the floating gate 108.

As shown in FIGS. 4C and 4D, the fin 102 and the fin 102a respectively include strained material portions 124 and strained material portions 124a. The strained material portions 124 and the strained material portions 124a are located on opposite sides of the floating gate 108. In some embodiments, the material of the strained material portions 124 and the strained material portions 124a includes SiGe, silicon carbon (SiC) or SiP, for example. In some embodiments, the strained material portions 124 and the strained material portions 124a are formed by selectively growing epitaxy. In some embodiments, the strained material portions 124 are implanted to form source and drain regions. The source and drain regions, also called strained source and drain regions, are located on the opposite sides of the floating gate 108. In some embodiments, contacts 118 are respectively located over the strained material portions 124 (source and drain regions), and conductive layers 120 are respectively connected with the contacts 118.

As shown in FIG. 4D, the control gate 150 includes the fin 102a. In some embodiments, the control gate 150 may further include contact slots 146 and a conductive layer 148. The contact slots 146 are connected with the fin 102a located on the opposite sides of the floating gate 108. The conductive layer 148 is connected with the contact slots 146. In some embodiments, a material of the contact slots 146 includes a metal-containing material, such as Al, Cu, W, Co, Ti, Ta, Ru, TiN, TiAl, TiAlN, TaN, TaC, NiSi, CoSi or a combination thereof. In some embodiments, a material of the conductive layer 148 includes a metal-containing material, such as Al, Cu, W, Co, Ti, Ta, Ru, TiN, TiAl, TiAlN, TaN, TaC, NiSi, CoSi or a combination thereof.

In some embodiments, the tunneling dielectric layer 106 located between the control gate 150 and the floating gate 108 serves as an inter-gate dielectric layer.

In some embodiments, the contact slots 146, the contacts 118, the conductive layer 148 and the conductive layer 120 are formed in the following steps: an interlayer dielectric layer 122 is formed over the substrate 100; the interlayer dielectric layer 122 is patterned to form contact holes; the contact slots 146 and the contacts 118 are formed to fill the contact holes; a conductive material layer is formed over the interlayer dielectric layer 122; and the conductive material layer is patterned to form the conductive layer 148 and the conductive layer 120. In some embodiments, the contact slots 146 and the contacts 118 are formed in the same process or different processes; and the conductive layer 148 and the conductive layer 120 are formed in the same process or different processes.

In some embodiments, the non-volatile memory cell as shown in FIGS. 4A-4D further includes an erase gate as shown in FIGS. 2A-2E or FIGS. 3A-3D. The control gate 150 and the erase gate as shown in FIGS. 2A-2E or FIGS. 3A-3D are located on opposite sides of the fin 102.

In the above embodiments, the control gate 150 includes the fin 102a, and an area between the control gate 150 and the floating gate 108 is increased to raise the gate coupling ratio (GCR) of the cell. Further, the memory cell has a small device size. The process for manufacturing the non-volatile memory is compatible to a FinFET process. The floating gate may be formed by a metal gate (MG) process of the FinFET process.

Figure 5A:
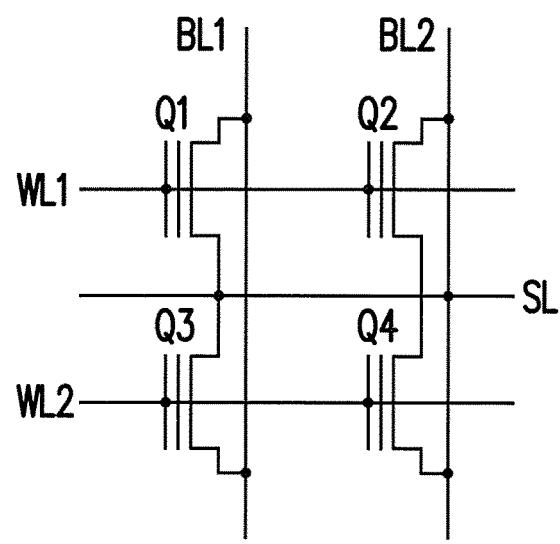
FIG. 5A is a circuit diagram of the non-volatile memory according to some embodiments of the present disclosure.
Figure 5B:
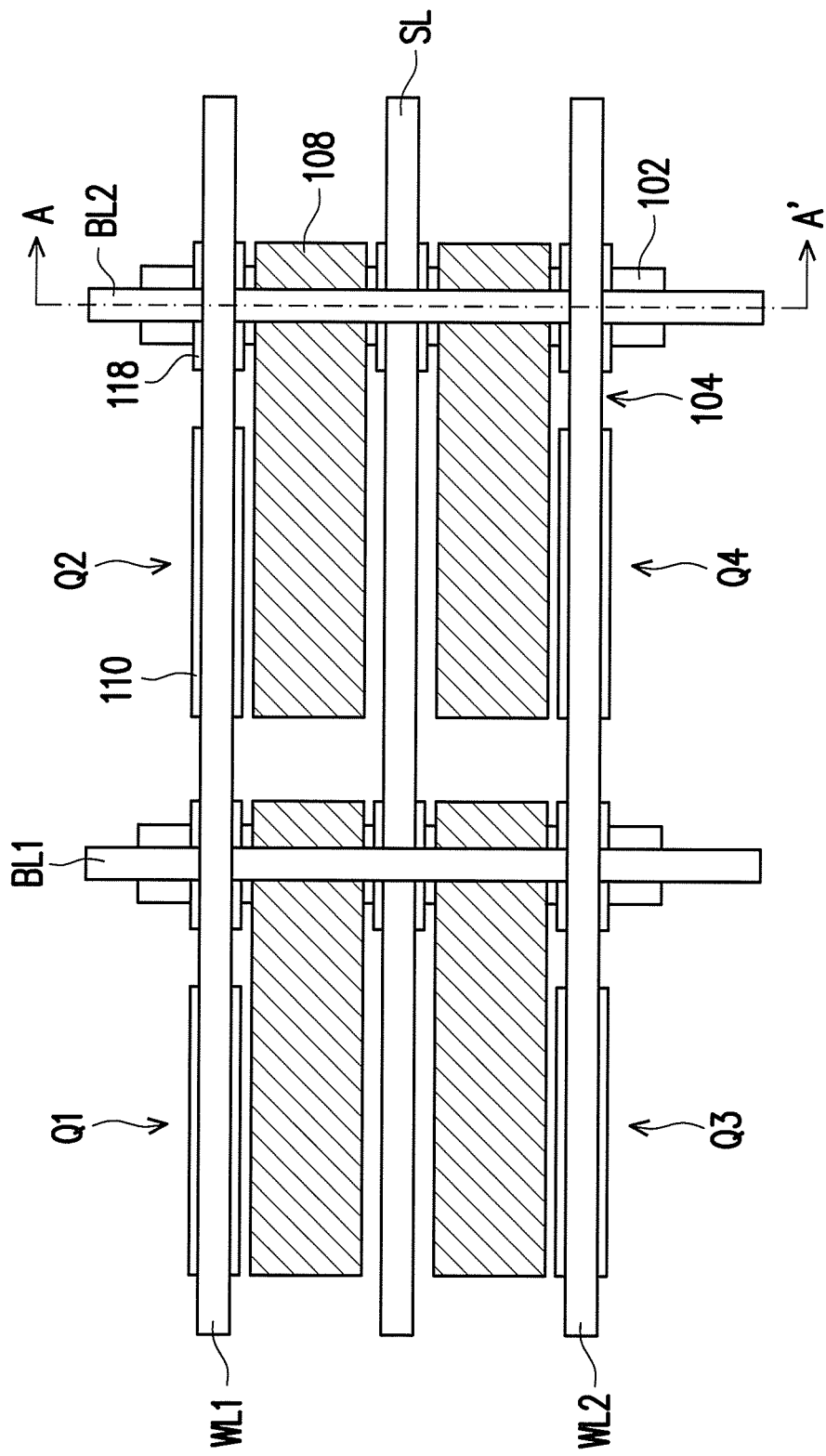
FIG. 5B is a top view showing the non-volatile memory according to some embodiments of the present disclosure.
Figure 5C:
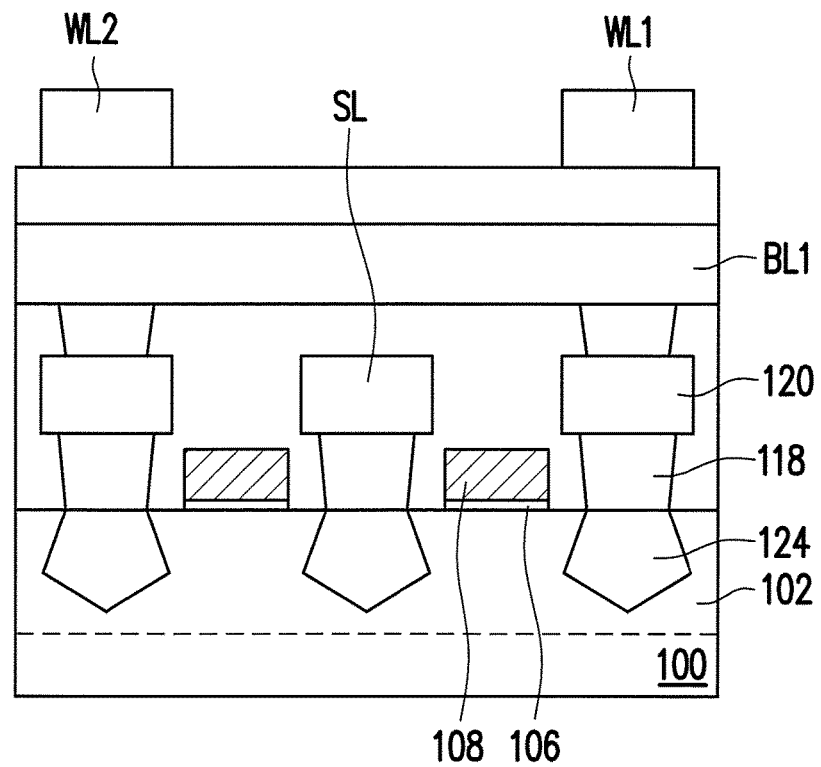
FIG. 5C is a cross-sectional view showing the non-volatile memory taken along the line A-A' of FIG. 5B according to some embodiments of the present disclosure.

In accordance with the embodiments, FIG. 5A is a circuit diagram of the non-volatile memory according to some embodiments of the present disclosure. FIG. 5B is a top view showing the non-volatile memory according to some embodiments of the present disclosure. FIG. 5C is a cross-sectional view showing the non-volatile memory taken along the line A-A' of FIG. 5B according to some embodiments of the present disclosure.

In FIGS. 5A-5C, elements that are identical to those in FIGS. 1A-1D are marked with the same numerals. Where the materials and properties of each of the layers described below are not specified in detail, they are regarded as identical to those in FIGS. 1A-1D.

As shown in FIGS. 5A, 5B, and 5C, a non-volatile memory includes memory cells Q1-Q4. In some embodiments, the memory cells respectively have a structure as shown in FIGS. 1A-1D. The memory cells Q1-Q4 are located over a substrate 100 that includes fins 102 and insulators 104 located over the substrate 100 and between the fins 102. The memory cells Q1-Q4 respectively include a floating gate 108 located over one of the fins 102 and the insulators 104 and a contact slot 110 (control gate) located over a sidewall of the floating gate 108 on the insulators 104. In some embodiments, the memory cells further include an erase gate as shown in FIGS. 2A-2E or FIGS. 3A-3D. The control gate 150 and the erase gate as shown in FIGS. 2A-2E or FIGS. 3A-3D are located on opposite sides of the fin 102. In some embodiments, the memory cells respectively have a structure as shown in FIGS. 4A-4D.

In some embodiments, the memory cells Q1-Q4 are arranged as an NOR type array. The non-volatile memory further includes bit lines BL1 and BL2 and word lines WL1 and WL2. The drain regions of the memory cells Q1 and Q3 are coupled to the bit line BL1 and the drain regions of the memory cells Q2 and Q4 are coupled to the bit line BL2. The control gates of the memory cells Q1 and Q2 are coupled to the word line WL1, and the control gates of the memory cells Q3 and Q4 are coupled to the word line WL2. The source regions of the memory cells Q1-Q4 share a common source line (SL).

Figure 6A:
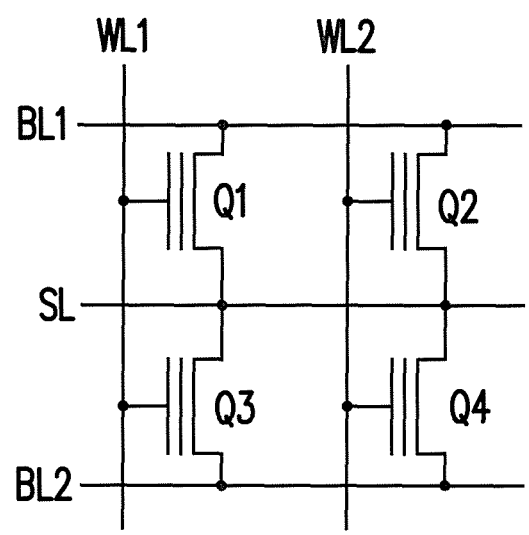
FIG. 6A is a circuit diagram of the non-volatile memory according to some embodiments of the present disclosure.
Figure 6B:
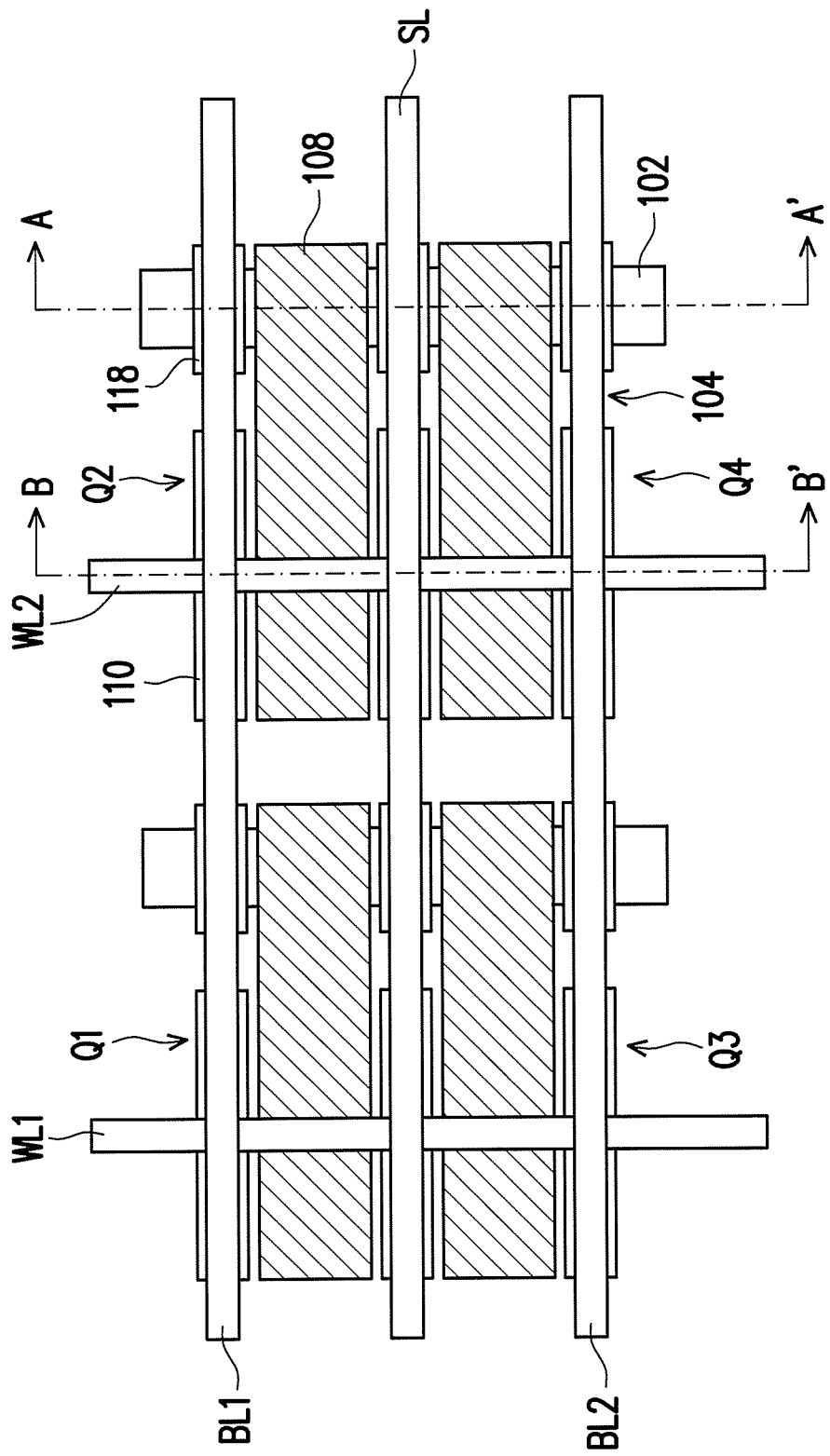
FIG. 6B is a top view showing the non-volatile memory according to some embodiments of the present disclosure.
Figure 6C:
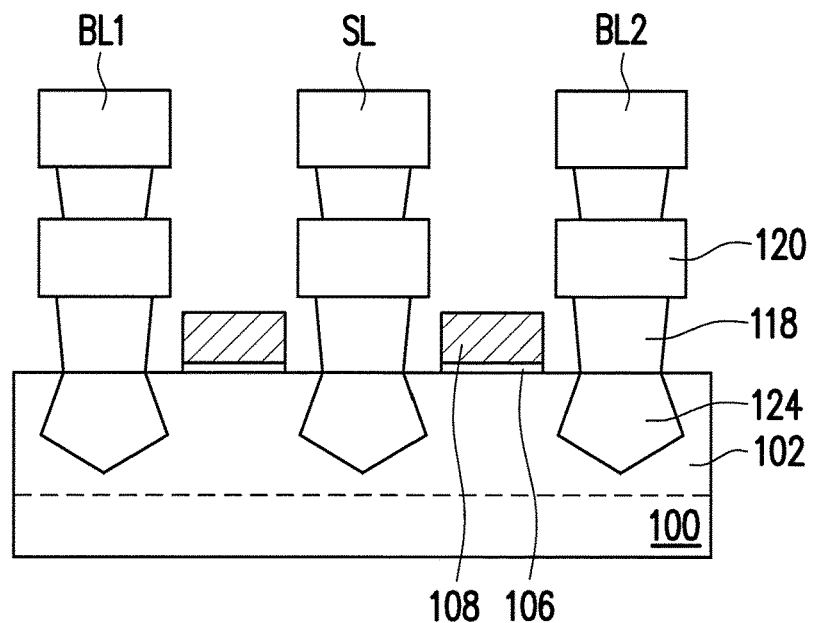
FIG. 6C is a cross-sectional view showing the non-volatile memory taken along the line A-A' of FIG. 6B according to some embodiments of the present disclosure.
Figure 6D:
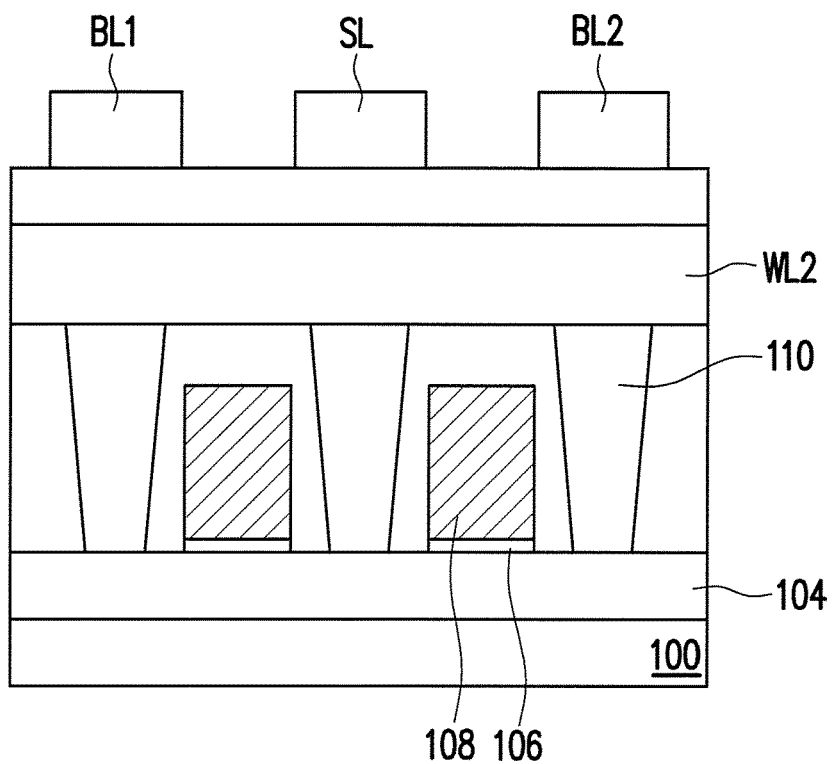
FIG. 6D is a cross-sectional view showing the non-volatile memory taken along the line B-B' of FIG. 6B according to some embodiments of the present disclosure.

In accordance with the embodiments, FIG. 6A is a circuit diagram of the non-volatile memory according to some embodiments of the present disclosure. FIG. 6B is a top view showing the non-volatile memory according to some embodiments of the present disclosure. FIG. 6C is a cross-sectional view showing the non-volatile memory taken along the line A-A' of FIG. 6B according to some embodiments of the present disclosure. FIG. 6D is a cross-sectional view showing the non-volatile memory taken along the line B-B' of FIG. 6B according to some embodiments of the present disclosure.

In FIGS. 6A-6D, elements that are identical to those in FIGS. 1A-1D are marked with the same numerals. Where the materials and properties of each of the layers described below are not specified in detail, they are regarded as identical to those in FIGS. 1A-1D.

As shown in FIGS. 6A, 6B, 6C and 6D, a non-volatile memory includes memory cells Q1-Q4. In some embodiments, the memory cells respectively have a structure as shown in FIGS. 1A-1D. The memory cells Q1-Q4 are located over a substrate 100 that includes fins 102 and insulators 104 located over the substrate 100 and between the fins 102. The memory cells Q1-Q4 respectively include a floating gate 108 located over one of the fins 102 and the insulators 104 and a contact slot 110 (control gate) located over sidewalls of the floating gate 108 on the insulators 104. In some embodiments, the memory cells further include an erase gate as shown in FIGS. 2A-2E or FIGS. 3A-3D. The control gate 150 and the erase gate as shown in FIGS. 2A-2E or FIGS. 3A-3D are located on opposite sides of the fin 102. In some embodiments, the memory cells respectively have a structure as shown in FIGS. 4A-4D.

In some embodiments, the memory cells Q1-Q4 are arranged as an AND type array. The non-volatile memory further includes bit lines BL1 and BL2 and word lines WL1 and WL2. The drain regions of the memory cells Q1 and Q2 are coupled to the bit line BL1 and the drain regions of the memory cells Q3 and Q4 are coupled to the bit line BL2. The control gates of the memory cells Q1 and Q3 are coupled to the word line WL1, and the control gates of the memory cells Q2 and Q4 are coupled to the word line WL2. The source regions of the memory cells Q1-Q4 share a common source line (SL).

In some embodiments of the present disclosure, a non-volatile memory cell is described. The non-volatile memory cell includes a substrate, insulators, a floating gate and a control gate. The substrate has a fin. The insulators are located over the substrate, wherein the fin is located between the insulators. The floating gate is located over the fin and the insulators. The control gate is located over the floating gate on the insulators and includes at least one of first contact slots located over the sidewalls of the floating gate.

In some embodiments of the present disclosure, a non-volatile memory cell is described. The non-volatile memory cell includes a substrate, insulators, a floating gate and a control gate. The substrate has a first fin and a second fin, wherein the second fin is located at a first side of the first fin and a conductive type of the second fin is different from that of the first fin. The insulators are located over the substrate, wherein the first fin and the second fin are respectively located between the insulators. The floating gate is located over the first fin, the insulators and the second fin. The control gate includes the second fin.

In some embodiments of the present disclosure, a non-volatile memory is described. The non-volatile memory includes memory cells. The memory cells are located over a substrate that includes fins and insulators located over the substrate and between the fins. The memory cells respectively include a floating gate located over one of the fins and the insulators and a control gate. The floating gate is located over one of the fins and the insulators. The control gate is located over a sidewall of the floating gate on the insulators.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A non-volatile memory cell, comprising:
 a substrate having a fin, wherein the fin extends along a first direction;
 a plurality of insulators located over the substrate, wherein the fin is located between the plurality of insulators;
 a floating gate located over the fin and the plurality of insulators and extending along a second direction perpendicular to the first direction;

a gate dielectric layer disposed over the plurality of the insulators and extending under the floating gate, wherein the gate dielectric layer is sandwiched between the fin and the floating gate and sandwiched between the floating gate and the plurality of the insulators overlapped with the floating gate along a stacking direction of the substrate and the plurality of insulators; and a control gate located over the floating gate on the plurality of insulators and comprising two first contact slots extending along the second direction and respectively located over two opposite sidewalls of the floating gate and a first conductive layer extending along the first direction and connected with the two first contact slots, wherein the control gate is in direct contact with at least one of the plurality of insulators, wherein in a vertical projection on the substrate along the stacking direction of the substrate and the plurality of insulators, the two first contact slots are spaced apart from the fin and the floating gate, the floating gate overlaps the fin, and the first conductive layer overlaps the floating gate.

2. The non-volatile memory cell of claim 1, further comprising an erase gate located over the floating gate on the plurality of insulators, wherein the erase gate comprises at least one of a plurality of second contact slots located over the two opposite sidewalls of the floating gate.

3. The non-volatile memory cell of claim 2, further comprising a second conductive layer connected with second contact slots of the plurality of second contact slots.

4. The non-volatile memory cell of claim 2, wherein the control gate and the erase gate are respectively located over the plurality of insulators respectively at two sides of the fin.

5. The non-volatile memory cell of claim 1, further comprising an intergate dielectric layer located between the control gate and the floating gate.

6. The non-volatile memory cell of claim 1, further comprising a tunneling dielectric layer located between the substrate and the floating gate.

7. A non-volatile memory, comprising:
a plurality of memory cells located over a substrate that comprises a plurality of fins and a plurality of insulators located over the substrate and between the plurality of fins, wherein the plurality of fins extend along a first direction, and the plurality of memory cells respectively comprise:
a floating gate located over one of the plurality of fins and the plurality of insulators and extending along a second direction perpendicular to the first direction; and
a control gate located over two opposite sidewalls of the floating gate on the plurality of insulators and comprising a conductive layer extending along the first direction and at least one first contact slot, wherein the control gate is in direct contact with at least one of the plurality of insulators and is connected with the at least one first contact slot,
wherein in a vertical projection on the substrate along a stacking direction of the substrate and the plurality of insulators, the conductive layer is spaced apart from the plurality of fins and overlaps the floating gate, the floating gate overlaps the one of the plurality of fins, and the conductive layer overlaps the floating gate.

8. The non-volatile memory of claim 7, wherein the at least one first contact slot is located on the two opposite sidewalls of the floating gate.

9. The non-volatile memory of claim 7, further comprising an erase gate located over the two opposite sidewalls of the floating gate on the plurality of insulators.

10. The non-volatile memory of claim 9, wherein the control gate and the erase gate are respectively located over the plurality of insulators respectively at two sides of the plurality of fins.

11. The non-volatile memory of claim 10, further comprising an inter-gate dielectric layer located between the control gate and the floating gate.

12. The non-volatile memory of claim 10, further comprising a tunneling dielectric layer located between substrate and the floating gate.

13. The non-volatile memory of claim 7, wherein the plurality of memory cells are arranged as an NOR type array.

14. The non-volatile memory of claim 7, wherein the plurality of memory cells are arranged as an AND type array.

15. A non-volatile memory cell, comprising:
a substrate having a fin, wherein the fin extends along a first direction;
a plurality of insulators located over the substrate, wherein the fin is located between the plurality of insulators;
a floating gate located over the fin and the plurality of insulators and extending along a second direction perpendicular to the first direction;
a control gate located over the floating gate on the plurality of insulators and comprising at least one of a plurality of first contact slots located over a plurality of sidewalls of the floating gate and a conductive layer connected to the at least one of a plurality of first contact slots, wherein the conductive layer extends along the first direction; and
an interlayer dielectric layer located between the control gate and the floating gate, wherein the at least one of a plurality of first contact slots penetrates through the interlayer dielectric layer,
wherein in a vertical projection on the substrate along a stacking direction of the substrate and the plurality of insulators, the conductive layer is spaced apart from the fin and overlaps the floating gate, the floating gate overlaps the fin, and the conductive layer overlaps the floating gate.

16. The non-volatile memory cell of claim 15, wherein the control gate is in direct contact with at least one of the plurality of insulators.

17. The non-volatile memory cell of claim 15, further comprising an erase gate located over the floating gate on the plurality of insulators, wherein the erase gate comprises at least one of a plurality of second contact slots located over the plurality of sidewalls of the floating gate.

* * * * *